(12) United States Patent
Xu et al.

(10) Patent No.: US 11,882,749 B2
(45) Date of Patent: Jan. 23, 2024

(54) DISPLAY SUBSTRATE, DISPLAY PANEL, AND DISPLAY DEVICE WITH POWER LINE BELOW DATA LINE

(71) Applicant: Kunshan Go-Visionox Opto-Electronics Co., Ltd., Jiangsu (CN)

(72) Inventors: Chuanzhi Xu, Jiangsu (CN); Zhengfang Xie, Jiangsu (CN); Lu Zhang, Jiangsu (CN); Junhui Lou, Jiangsu (CN)

(73) Assignee: Kunshan Go-Visionox Opto-Electronics Co., Ltd.

( * ) Notice: Subject to any disclaimer, the term of this patent is extended or adjusted under 35 U.S.C. 154(b) by 463 days.

(21) Appl. No.: 17/353,277

(22) Filed: Jun. 21, 2021

(65) Prior Publication Data

US 2021/0313405 A1    Oct. 7, 2021

Related U.S. Application Data

(63) Continuation of application No. PCT/CN2020/079636, filed on Mar. 17, 2020.

(30) Foreign Application Priority Data

May 31, 2019  (CN) .......................... 201910470777.7

(51) Int. Cl.
  *H10K 59/35*  (2023.01)
  *H10K 50/84*  (2023.01)
  *H10K 59/131*  (2023.01)

(52) U.S. Cl.
  CPC .......... *H10K 59/353* (2023.02); *H10K 50/84* (2023.02); *H10K 59/131* (2023.02)

(58) Field of Classification Search
  CPC .......................... H10K 59/353; H10K 59/131
  See application file for complete search history.

(56) References Cited

U.S. PATENT DOCUMENTS

| 11,094,772 B2 | 8/2021 | Ma et al. |
| 2012/0139955 A1 | 6/2012 | Jaffari et al. |
| (Continued) | | |

FOREIGN PATENT DOCUMENTS

| CN | 106067476 A | 11/2016 |
| CN | 107993580 A | 5/2018 |
| (Continued) | | |

OTHER PUBLICATIONS

Decision of Grant (CN Application No. 2019104707777) with English Translation, dated Sep. 17, 2020, 6 pages.

(Continued)

*Primary Examiner* — Lex H Malsawma
*Assistant Examiner* — Bruce R. Smith
(74) *Attorney, Agent, or Firm* — Quarles & Brady LLP

(57) ABSTRACT

A display substrate, a display panel, and a display device are disclosed. The display substrate includes first and second display regions and sub-pixels. The sub-pixels are divided into first-type and second-type pixel groups arranged in a second direction. The first-type pixel group includes first and second sub-pixels located in the first and second display regions. The second-type pixel group includes second sub-pixels. The second sub-pixels of at least one of the first-type and the second-type pixel groups are disposed at two sides of the first display region in a first direction. The pixel circuits corresponding to the first and second sub-pixels in one first-type pixel group are connected to one first-type data line. The pixel circuits corresponding to the second sub-pixels in one second-type pixel group are connected to one (Continued)

second-type data line. A power line is disposed below a first-type data line in the first display region.

20 Claims, 15 Drawing Sheets

(56) References Cited

U.S. PATENT DOCUMENTS

| | | | |
|---|---|---|---|
| 2018/0097022 A1 | 4/2018 | Evans et al. | |
| 2018/0129328 A1 | 5/2018 | Park et al. | |
| 2018/0219058 A1* | 8/2018 | Xiang | H10K 59/00 |
| 2018/0269268 A1 | 9/2018 | Cai et al. | |
| 2020/0058726 A1 | 2/2020 | Ma et al. | |
| 2020/0227488 A1 | 7/2020 | Xin et al. | |
| 2021/0064087 A1 | 3/2021 | Ma et al. | |
| 2021/0313405 A1 | 10/2021 | Xu et al. | |

FOREIGN PATENT DOCUMENTS

| | | | | |
|---|---|---|---|---|
| CN | 108881530 A | | 11/2018 | |
| CN | 108922900 A | * | 11/2018 | H01L 27/3218 |
| CN | 108983872 A | | 12/2018 | |
| CN | 109037298 A | | 12/2018 | |
| CN | 109256399 A | | 1/2019 | |
| CN | 109560089 A | | 4/2019 | |
| CN | 109599052 A | | 4/2019 | |
| CN | 109599053 A | | 4/2019 | |
| CN | 109728046 A | | 5/2019 | |
| CN | 109755282 A | | 5/2019 | |
| CN | 110767141 A | | 2/2020 | |
| CN | 110767662 A | | 2/2020 | |

OTHER PUBLICATIONS

English Translation of International Search Report (International Application No. PCT/CN2020/079636), dated Jun. 23, 2020, 10 pages.
Chinese First Office Action 100191 (CN Application No. 201910470777.7) with English Translation, dated Jul. 1, 2020, 7 pages.
Office Action(U.S. Appl. No. 18/176,071) dated May 10, 2023.

* cited by examiner

DISPLAY SUBSTRATE, DISPLAY PANEL, AND DISPLAY DEVICE WITH POWER LINE BELOW DATA LINE

CROSS-REFERENCE TO RELATED APPLICATIONS

This application is a continuation under 35 U.S.C. § 120 of international patent application No. PCT/CN2020/079636, entitled "Display Substrate, Display Panel, and Display Device", filed on Mar. 17, 2020, which claims benefits of China Patent Application No. 201910470777.7, entitled "Display Substrate, Display Panel, and Display Device", filed on May 31, 2019, and the entire content of which are incorporated herein by reference in their entireties for all purposes.

TECHNICAL FIELD

The present disclosure relates to the field of display technology.

BACKGROUND

Users' demand for a higher screen-to-body ratio is increasing with a rapid development of electronic devices, and the full-screen display of the electronic devices has received more and more attention in the industry. A conventional electronic device, such as a mobile phone, a tablet computer, or the like, may need to integrate with additional members such as a front-mounted camera, an earphone, an infrared sensor, and the like. To achieve this, a display screen of the electronic device can be notched, and the camera, the earphone, the infrared sensor, and the like are disposed in the notched area of the display screen.

SUMMARY

A display substrate, including a display region, wherein the display region includes a first display region and a second display region. Alight transmittance of the first display region is greater than a light transmittance of the second display region.

The display region includes a plurality of sub-pixels. The plurality of sub-pixels are divided into a plurality of pixel groups arranged in a second direction. The plurality of pixel groups includes a plurality of first-type pixel groups and a plurality of second-type pixel groups.

The plurality of sub-pixels includes a plurality of first sub-pixels disposed in the first display region and a plurality of second sub-pixels disposed in the second display region. A distribution density of the plurality of first sub-pixels is smaller than a distribution density of the plurality of second sub-pixels.

Each of the plurality of first-type pixel groups includes a first set of the plurality of first sub-pixels arranged in a first direction and a first set of the plurality of second sub-pixels arranged in the first direction. Each of the plurality of second-type pixel groups includes a second set of the plurality of second sub-pixels arranged in the first direction. The second sub-pixels of at least one of each of the first-type pixel groups and each of the second-type pixel groups is disposed at two opposite sides of the first display region in the first direction.

The display region includes a plurality of first-type data lines, a plurality of second-type data lines, at least one power line, and a plurality of pixel circuits corresponding to the plurality of sub-pixels in a one-to-one manner. The pixel circuits corresponding to the first sub-pixels and the pixel circuits corresponding to the second sub-pixels in a same first-type pixel group are connected to a same first-type data line. The pixel circuits corresponding to the second sub-pixels in a same second-type pixel group are connected to a same second-type data line.

In a thickness direction of the display substrate, a first-display-region-located portion of each of the at least one power line is located below a first-display-region-located portion of each of the plurality of first-type data lines.

A display panel includes the display substrate, and an encapsulation structure encapsulating the display substrate.

A display device includes a device body having a member arranging region and the display panel covering the device body, wherein the member arranging region is located below the first display region and includes at least one photosensitive member configured for emitting or receiving light through the first display region.

The details of one or more embodiments of the present disclosure are set forth in the following drawings and description. Other features, objects, and advantages of the present disclosure will become apparent from the description, drawings, and claims.

BRIEF DESCRIPTION OF THE DRAWINGS

In order to illustrate the embodiments of the present disclosure more clearly, the drawings used in the embodiments will be described briefly. Apparently, the following described drawings are merely for the embodiments of the present disclosure, and other drawings can be derived by those of ordinary skill in the art without any creative effort.

DETAILED DESCRIPTION

Figure 1:
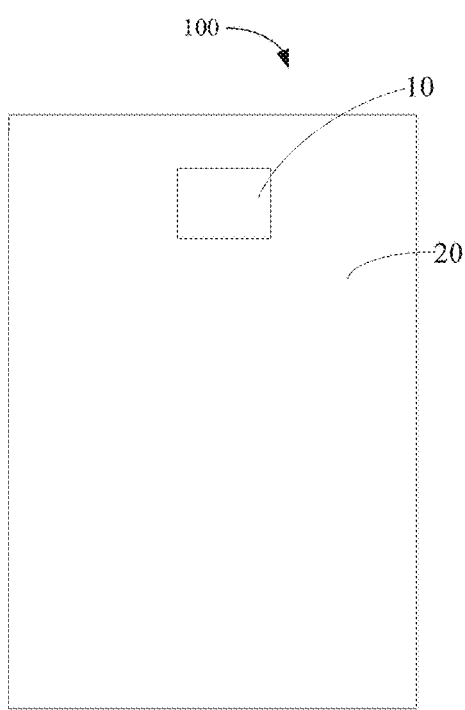
FIG. 1 is atop view of a display substrate of an embodiment provided by the present disclosure.

For the electronic device implementing an image capture function, external light can enter to a photosensitive member located below the display screen through the notched area. However, the notched area of the display screen cannot be used to display an image. Therefore, the display screen cannot realize a true full-screen display.

In order to facilitate understanding of the present disclosure, the present disclosure will be described in detail below with reference to the related drawings. Some embodiments of the present disclosure are shown in the drawings. However, the present disclosure can be embodied in many different forms and is not limited to the embodiments described herein. Rather, the purpose of these embodiments is to provide a thorough understanding of the present disclosure.

A full-screen display of an electronic device can be realized while ensuring a normal operation of a photosensitive member by arranging a non-transparent display screen and a transparent display screen in the electronic device and arranging the photosensitive member below the transparent display screen. A driving mode of the non-transparent display screen is an active driving mode, and a driving mode of the transparent display screen is a passive driving mode. When the transparent display screen and the non-transparent display screen are both provided in the electronic device, two driving modes are required to be set in the screen body, which terribly increases the complexity of a full-screen driver. The present disclosure provides embodiments of a display substrate, a display panel, and a display device, which can address the above-described problems.

The embodiments of the display substrate, the display panel, and the display device provided by the present disclosure will be described hereinafter in detail with reference to the accompanying drawings. Features in the following embodiments and examples can be complemented or combined with each other as long as such features do not contradict with each other.

An embodiment of the present disclosure provides a display substrate, the display substrate includes a display region. Referring to FIG. 1 and FIGS. 2A to 2C, the display region of the display substrate 100 includes a first display region 10 and a second display region 20. A light transmittance of the first display region 10 is greater than a light transmittance of the second display region 20. The display region of the display substrate 100 includes a plurality of sub-pixels. The sub-pixels are arranged in the form of an array and can be divided into a plurality of pixel groups. Optionally, the plurality of sub-pixels are divided into a plurality of pixel groups arranged in the second direction. Each of the pixel groups includes a plurality of sub-pixels arranged in a first direction.

Figure 3:
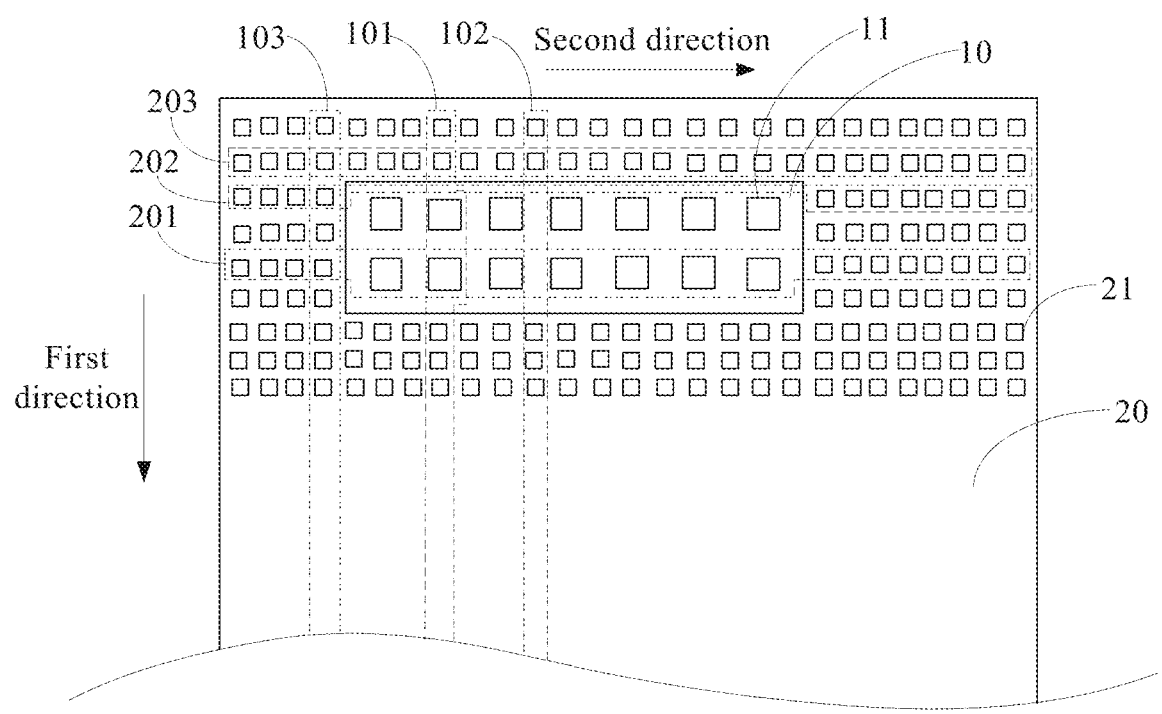
FIG. 3 is a schematic partial view of a layout of sub-pixels of the display substrate shown in FIG. 1.
Figure 5:
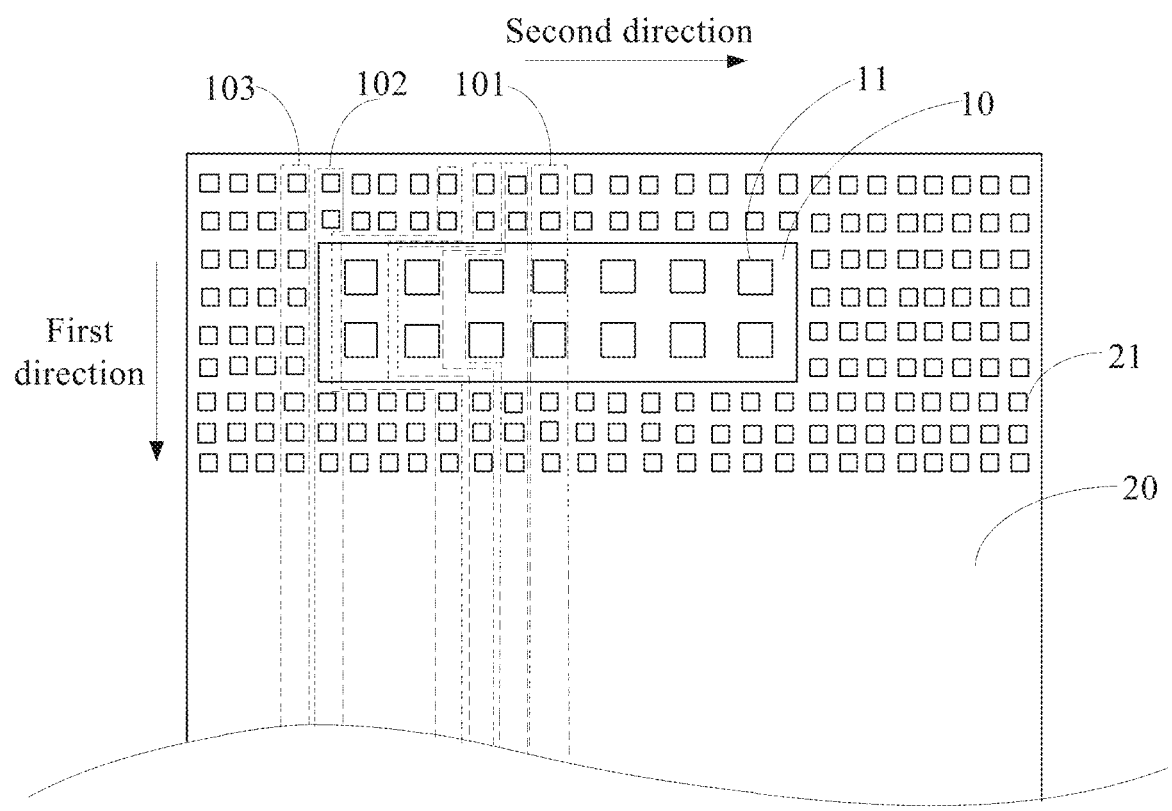
FIG. 5 is a schematic partial view of another layout of sub-pixels of the display substrate shown in FIG. 1.

Referring to FIGS. 3 and 5, the plurality of pixel groups include a plurality of first-type pixel groups 101 and a plurality of second-type pixel groups 102. The first display region 10 includes a plurality of first sub-pixels 11, and the second display region 20 includes a plurality of second sub-pixels 21. A distribution density of the first sub-pixels 11 is smaller than a distribution density of the second sub-pixels 21. The distribution density refers to the number of the sub-pixels located in per unit area of the display region. Each first-type pixel group 101 includes first sub-pixels 11 and second sub-pixels 21. Each second-type pixel group 102 merely includes second sub-pixels 21. The second sub-pixels 21 of the same first-type pixel group 101 are arranged at two opposite sides of the first display region 10 in the first direction; and/or the second sub-pixels 21 of the same second-type pixel group 102 are arranged at two opposite sides of the first display region 10 in the first direction.

Figure 4:
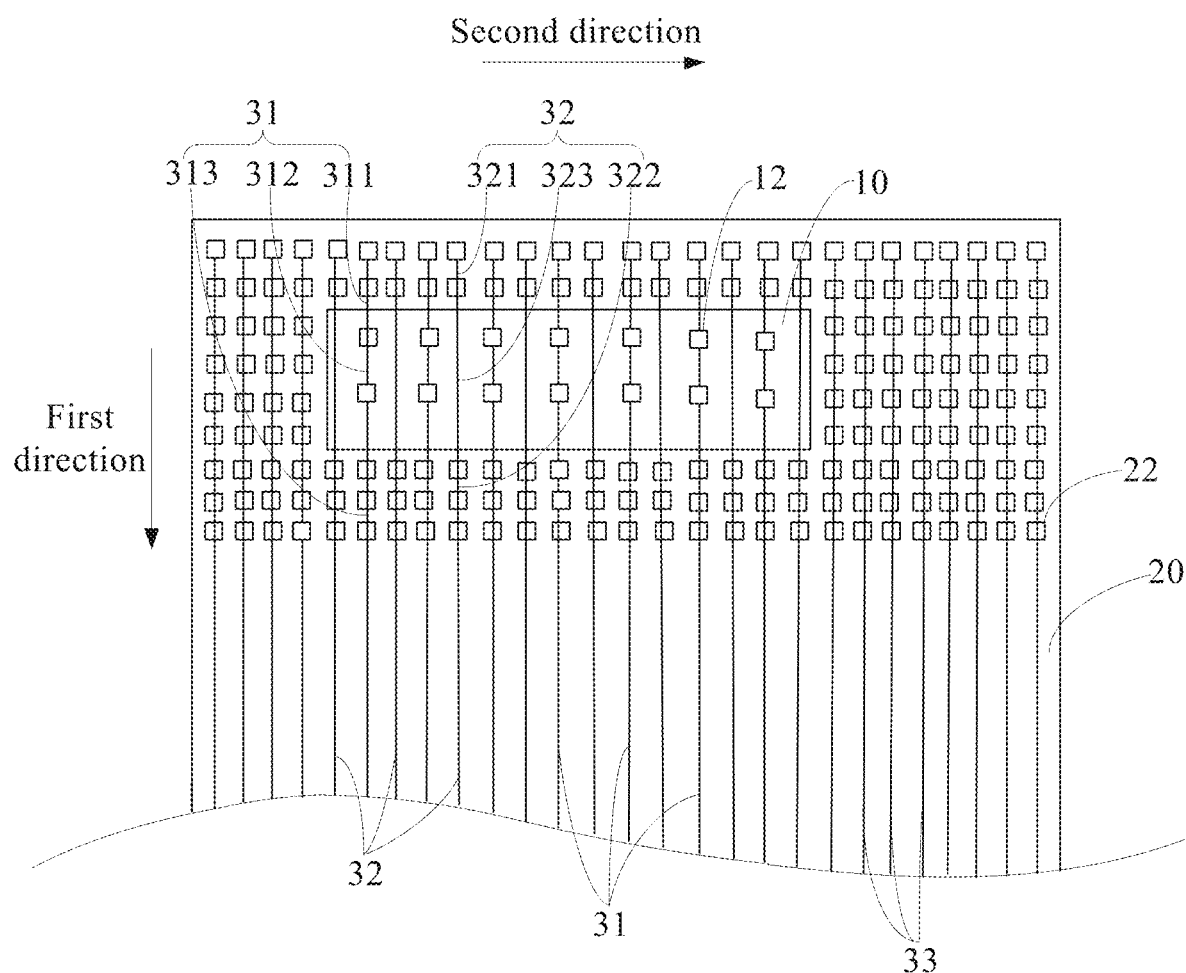
FIG. 4 is a schematic view of a layout of data lines of the display substrate, corresponding to FIG. 3.
Figure 6:
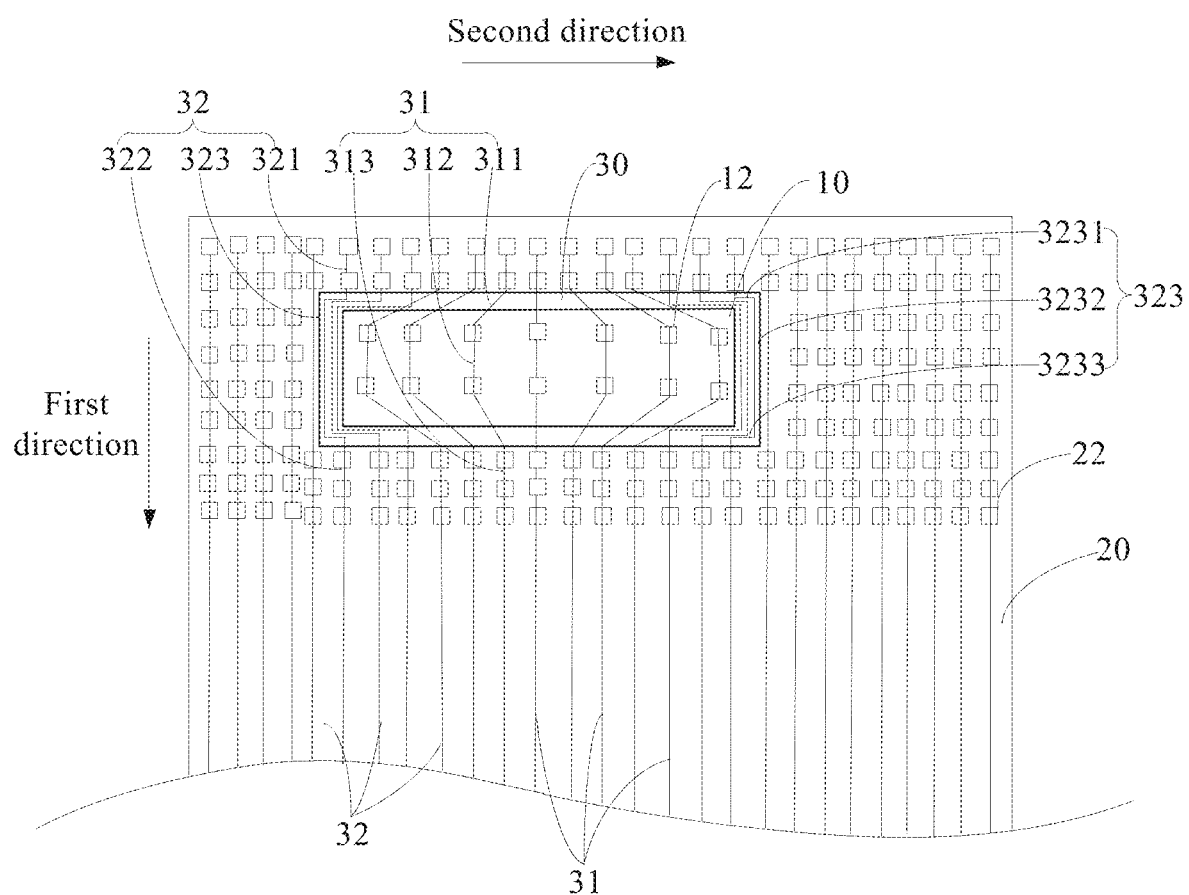
FIG. 6 is a schematic view of a layout of data lines of the display substrate, corresponding to FIG. 5.

Referring to FIGS. 4 and 6, the display substrate 100 includes a plurality of first-type data lines 31, a plurality of second-type data lines 32, a plurality of pixel circuits 12 disposed correspondingly to the first sub-pixels 11, a plurality of pixel circuits 22 disposed correspondingly to the second sub-pixels 21, and at least one power line. Optionally, each of the at least one power line is a lead wire connected to the ELVDD. All pixel circuits 12 disposed correspondingly to the first sub-pixels 11 and all pixel circuits 22 disposed correspondingly to the second sub-pixels 21 in the same first-type pixel group 101 are connected to the same first-type data line 31. All pixel circuits 22 disposed correspondingly to the second sub-pixels 21 in the same second-type pixel group 102 are connected to the same second-type data line 32. The pixel circuits 12 which are corresponding to the first sub-pixels 11 can be disposed in the first display region 10, and the pixel circuits 22 which are corresponding to the second sub-pixels 21 can be disposed in the second display region 20. Optionally, the pixel circuits which are corresponding to the sub-pixels are disposed below the sub-pixels in a thickness direction of the display substrate 100 in a one-to-one manner.

Figure 7A:
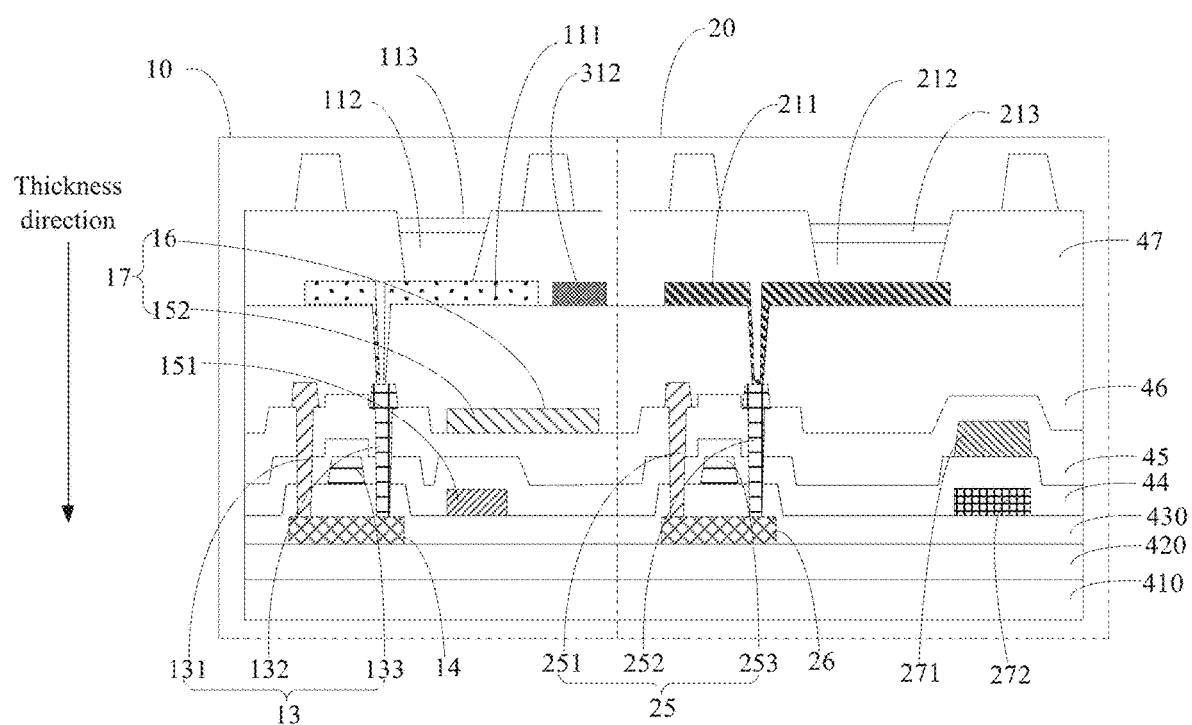
FIG. 7A is a sectional view of the display substrate shown in FIG. 1 along a first direction.

Referring to FIG. 7A, each power line has a portion 16 that is located in the first display region 10, the portion 16 of the power line which is located in the first display region 10 is disposed below a portion of the first-type data line 31 which is located in the first display region 10 in the thickness direction of the display substrate 100. The portion of the first-type data line 31 which is located in the first display region 10 is a fifth segment 312 of the first-type data line 31. The portion 16 of the power line which is located in the first display region 10 is hereafter called "first-display-region-located portion of the power line", the portion of the power line which is located in the second display region 20 is hereafter called "second-display-region-located portion of the power line". The portion of the first-type data line 31 which is located in the first display region 10 is also hereafter called "first-display-region-located portion of the first-type data line 31", the portion of the first-type data line 31 which is located in the second display region 20 is also hereafter called "second-display-region-located portion of the first-type data line 31".

In the display substrate 100 provided by embodiments of the present disclosure, since the light transmittance of the first display region 10 is greater than the light transmittance of the second display region 20, the photosensitive member can be disposed below the first display region 10, thereby realizing the full-screen display of the display substrate 100 while ensuring the normal operation of the photosensitive member. Since the pixel circuits 12 corresponding to the first sub-pixels 11 and the pixel circuits 22 corresponding to the second sub-pixels 21 in the same first-type pixel group 101 are all connected to the same first-type data line 31, the first sub-pixels 11 and the second sub-pixels 21 in the first-type pixel group 101 can be driven by the same first-type data line 31, so that the wiring complexity in the display region of the display substrate 100 can be reduced, and the first display region 10 and the second display region 20 can achieve more consistent display effect to improve the user experience as well. Since the first-display-region-located portion 16 of the power line is disposed below the first-display-region-located portion of the first-type data line 31, signal interference between the first-display-region-located portion of the first-type data line 31 and another signal line (such as a gate line) that is located in the first display region 10 and below the power line can be reduced by the first-display-region-located portion 16 of the power line, thereby improving the stability of signals received by the first-type data line 31 and the other signal line located below the power line in the first display region 10, and improving the display effect of the display substrate.

Figure 2A:
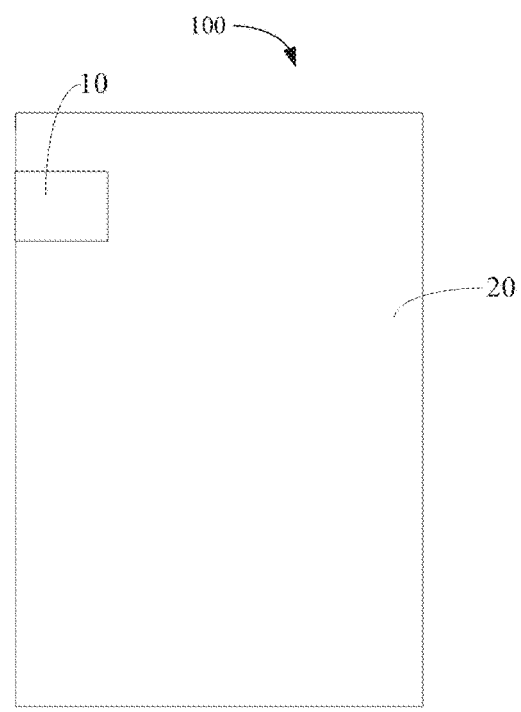
FIG. 2A is a top view of the display substrate of another embodiment provided by the present disclosure.
Figure 2B:
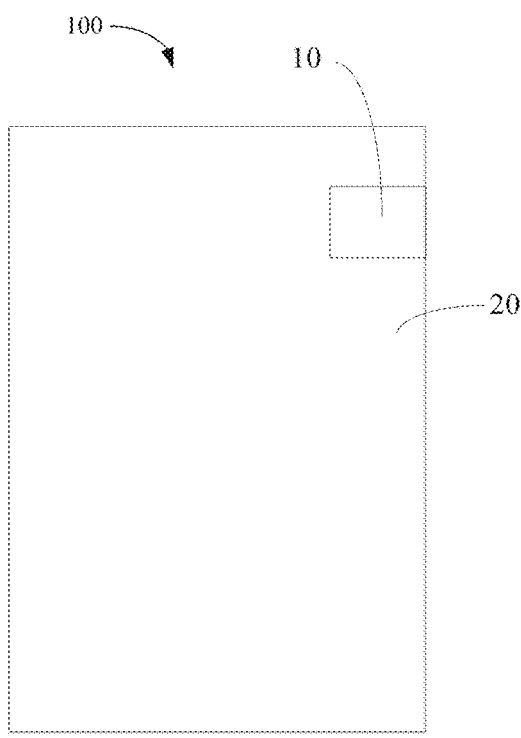
FIG. 2B is a top view of the display substrate of yet another embodiment provided by the present disclosure, in which a position of a first display region is different from that in FIG. 2A.
Figure 2C:
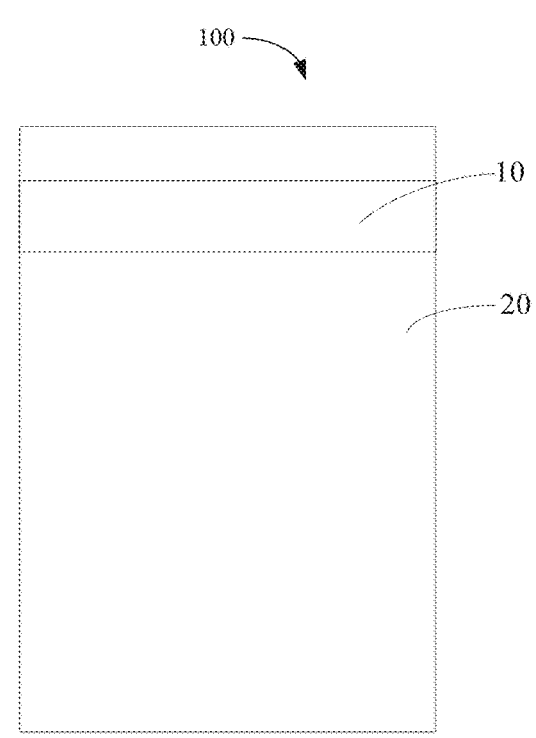
FIG. 2C is a top view of the display substrate of yet another embodiment provided by the present disclosure, in which a position of the first display region is different from that in FIG. 2A.

In an embodiment of the display substrate 100 provided by the present disclosure, as shown in FIG. 1, the first display region 10 can be completely surrounded by the second display region 20. Alternatively, the first display region 10 can be partially surrounded by the second display region 20. As shown in FIGS. 2A and 2B, an edge of the first display region 10 and an edge of the entire display region coincide, and the edge of the entire display region extends in the first direction. As shown in FIG. 2C, two opposite edges of the first display region 10 and two opposite edges of the entire display region coincide respectively, and the two edges of the entire display region both extend in the first direction. In the structures shown in FIG. 1, and FIGS. 2A to 2C, the second sub-pixels 21 of the first-type pixel group 101 and the second-type pixel group 102 are all arranged at two opposite sides of the first display region 10 in the first direction.

In an embodiment of the present disclosure, the first-type pixel group 101 and the second-type pixel group 102 include a plurality of sub-pixels arranged in the first direction, which means that the plurality of sub-pixels in the same pixel group are arranged substantially in the first direction. The first-direction axes of the plurality of sub-pixels respectively in the same pixel group may or may not coincide. For example, as shown in FIG. 5, the plurality of sub-pixels in the same pixel group are arranged in the first direction and spaced from each other, and the plurality of sub-pixels in the same pixel group are arranged in a staggered manner in the first direction.

Referring to FIGS. 4 and 6, the pixel circuits 12 corresponding to the first sub-pixels 11 and the pixel circuits 22 corresponding to the second sub-pixels 21 can be 2T1C circuits, 3T1C circuits, 3T2C circuits, 7T1C circuits, or 7T2C circuits, where T denotes a transistor and C denotes a storage capacitor. The type of the pixel circuits corresponding to the first sub-pixels 11 and the type of the pixel circuits corresponding to the second sub-pixels 21 can be the same or different.

Referring to FIG. 7A, each first sub-pixel 11 includes a first electrode 111, a first light-emitting structure 112 located on the first electrode 111, and a second electrode 113 located on the first light-emitting structure 112. Each second sub-pixel 21 includes a third electrode 211, a second light-emitting structure 212 located on the third electrode 211, and a fourth electrode 213 located on the second light-emitting structure 212.

The display substrate 100 can further include a substrate 410, a buffer layer 420 located on the substrate 410, semiconductor layers 26 and 14 formed on the buffer layer 420, a gate insulating layer 430 formed on the semiconductor layers 26 and 14, a capacitor insulating layer 44 located on the gate insulating layer 430, an interlayer dielectric layer 45 located on the capacitor insulating layer 44, a planarization layer 46 located on the interlayer dielectric layer 45, and a pixel defining layer 47 located on the planarization layer 46.

The pixel circuit 22 of each second sub-pixel 21 includes a second transistor 25 and a second capacitor. The second transistor 25 includes a source 251, a drain 252, and a gate 253. Gate 253 is located between the gate insulating layer 430 and the capacitor insulating layer 44. The source 251 and the drain electrode 252 are located on the interlayer dielectric layer 45 and are in contact with the semiconductor layer 26 through holes respectively defined in the gate insulating layer 430, the capacitor insulating layer 44, and the interlayer dielectric layer 45. The second capacitor includes an upper electrode plate 271 and a lower electrode plate 272. The upper electrode plate 271 is located between the capacitor insulating layer 44 and the interlayer dielectric layer 45. The lower electrode plate 272 is located between the gate insulating layer 430 and the capacitor insulating layer 44. The third electrode 211 is located between the planarization layer 46 and the pixel defining layer 47.

The pixel circuit 12 of each first sub-pixel 11 includes a first transistor 13 and a first capacitor. The first transistor 13 includes a source 131, a drain 132, and a gate 133. Gate 133 is located between the gate insulating layer 430 and capacitor insulating layer 44. The source 131 and the drain electrode 132 are located on the interlayer dielectric layer 45 and are in contact with the semiconductor layer 14 through holes respectively defined in the gate insulating layer 430, the capacitor insulating layer 44, and the interlayer dielectric layer 45. The first capacitor includes an upper electrode plate 152 and a lower electrode plate 151. The upper electrode plate 152 is located between the capacitor insulating layer 44 and the interlayer dielectric layer 45. The lower electrode plate 151 is located between the gate insulating layer 430 and the capacitor insulating layer 44. The first electrode 111 is located between the planarization layer 46 and the pixel defining layer 47.

Optionally, a first conducting layer 17 can be provided in the first display region 10. A portion of the first conducting layer 17 can be served as the upper electrode plate 152 of the first capacitor, and another portion of the first conducting layer 17 can be served as the first-display-region-located portion 16 of the power line. In this manner, the first-display-region-located portion 16 of the power line and the upper electrode plate 152 of the first capacitor can be formed in the same step, and there is no need to form a connecting structure between the first-display-region-located portion 16 of the power line and the upper electrode plate 152 of the first capacitor after the formation of the first-display-region-located portion 16 of the power line and the upper electrode plate 152 of the first capacitor, so that the manufacture of the display substrate 100 can be simplified.

Figure 7B:
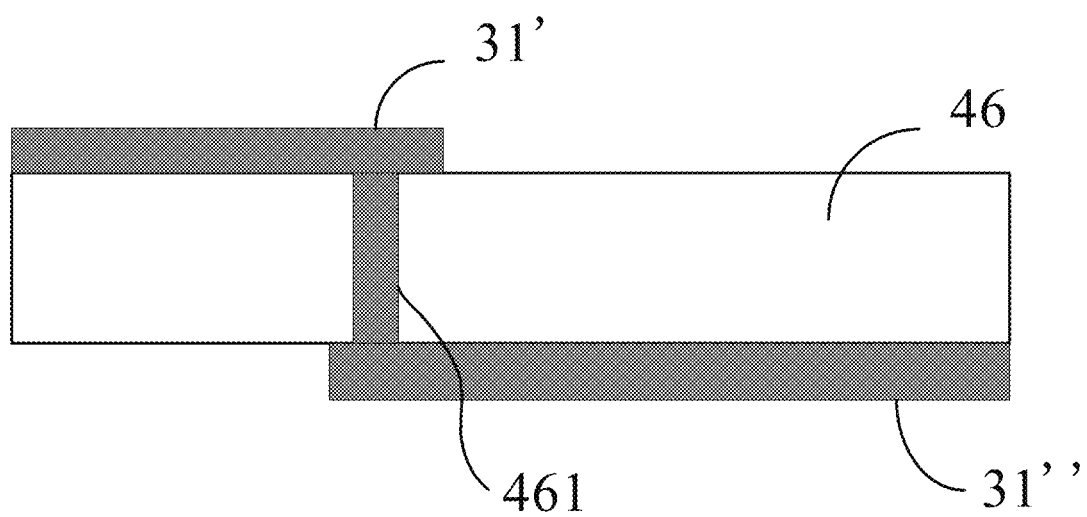
FIG. 7B is a sectional view of the display substrate shown in FIG. 1 along a second direction, showing only an insulating layer and a first-type data line.

Optionally, the first-display-region-located portion (such as the fifth segment 312) of the first-type data line 31 and the first electrode 111 can be disposed in the same layer. In this manner, the first-display-region-located portion of the first-type data line 31 and the first electrode 111 can be formed in the same process step, so that the complexity of the manufacture can be reduced. Optionally, a second-display-region-located portion of the first-type data line 31 and the first-display-region-located portion of the first-type data line 31 can be disposed in different layers. An insulating layer is disposed between the first-display-region-located portion of the first-type data line 31 and the second-display-regionlocated portion of the first-type data line 31. Referring to FIG. 7B, the first-display-region-located portion 31' of the first-type data line 31 and the second-display-region-located portion 31" of the first-type data line 31 are respectively disposed on two opposite surfaces of the insulating layer. The insulating layer is provided with a first through-hole 461. The first-display-region-located portion 31' of the first-type data line 31 is connected to the second-display-region-located portion 31" of the first-type data line 31 through the first through-hole 461 of the insulating layer. Optionally, the insulating layer is the planarization layer 46.

Referring to FIGS. 4 and 6, each first-type data line 31 can include a fourth segment 311, the fifth segment 312, and a sixth segment 313 connected in sequence. The fourth segment 311 and the sixth segment 313 are located in the second display region 20. The fifth segment 312 is the first-display-region-located portion of the first-type data line 31. The fifth segment 312 and the first electrode 111 can be located in the same layer.

The fourth segment 311, the sixth segment 313, and the source 251, and the drain 252 of the second transistor 25 can be formed in the same process step. When the first-display-region-located portion of the first-type data line 31 and the first electrode 111 are disposed in the same layer, the insulating layer between the fifth segment 312 and fourth segment 311, sixth segment 313 includes the planarization layer 46.

Optionally, referring to FIGS. 4 and 6, when the second sub-pixels 21 of the second-type pixel group 102 are arranged at two opposite sides of the first display region 10 in the first direction, each second-type data line 32 can include a first segment 321, a second segment 322, and a third segment 323. The first segment 321 and the second segment 322 are located in the second display region 20 and are located at two opposite sides of the first display region 10 in the first direction. The first segment 321 and the second segment 322 are connected by the third segment 323. Two embodiments of arrangement of the third segment 323 can be as follows.

In a first embodiment, referring to FIG. 4, the third segment 323 is located in the first display region 10.

Optionally, a light transmittance of the third segment 323 can be greater than or equal to 70%. Optionally, the light transmittance of the third segment 323 can be greater than or equal to 90%. For example, the light transmittance of the third segment 323 can be 90%, 95%, etc. In this manner, the light transmittance of the first display region 10 can be relatively high to satisfy the light-receiving requirement of the photosensitive member disposed below the first display region 10.

The material of the third segment 323 can include at least one of indium tin oxide, indium zinc oxide, silver-doped indium tin oxide, and silver-doped indium zinc oxide. Optionally, the third segment 323 is made of silver-doped indium tin oxide or silver-doped indium zinc oxide, to reduce the resistance of the third segment 323 while ensuring a high light transmittance of the first display region 10.

Optionally, the first segment 321 and the second segment 322 can be disposed in the same layer. That is, the first segment 321 and the second segment 322 are formed in the same process step. The first segment 321 and the third segment 323 are disposed in different layers. An insulating layer is disposed between the third segment 323 and the first segment 321. The insulating layer is provided with a plurality of second through-holes. The first segment 321 and the second segment 322 are respectively connected to the third segment 323 through the corresponding second through-holes. A connection between other conducting members on two opposite sides of the insulting layer through a through-hole, for example, respectively connecting the first segment 321 and the second segment 322 to the third segment 323 through the second through-holes, can be implemented by the same or similar structure as shown in FIG. 7B.

Optionally, the third segment 323 and the first electrode 111 can be disposed in the same layer. The first segment 321, the second segment 322, and the power line can be disposed in the same layer. In this manner, the third segment 323 and the first electrode 111 can be formed in the same process step. The first segment 321, the second segment 322, and the second-display-region-located portion of the power line can be formed in the same process step, so that the complexity of the manufacture of the display substrate can be reduced, and the manufacturing process can be simplified. In this embodiment, the insulating layer between the first segment 321 and the third segment 323 is the planarization layer 46.

Figure 8:
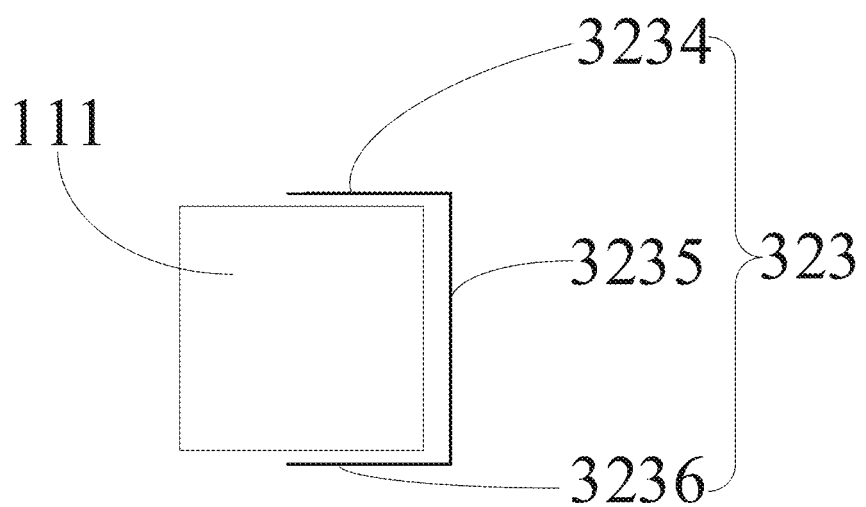
FIG. 8 is a partial schematic structural view of the display substrate shown in FIG. 1.

Referring to FIG. 8, the third segment 323 can surround a portion of the first electrode 111. The third segment 323 includes a first sub-segment 3234, a second sub-segment 3235, and a third sub-segment 3236 connected in sequence. The second sub-segment 3235 extends in the first direction. Both the first sub-segment 3234 and the third sub-segment 3236 extend in the second direction. The first sub-segment 3234 is connected to the first segment 321. The third sub-segment 3236 is connected to the second segment 322. As the first electrode 111 and the third electrode 323 are disposed in the same layer, and the third segment 323 surrounds the first electrode 111, the third segment 323 will have a relatively small effect on the position and size of the first electrode 111.

The first-type data lines 31, the second-type data lines 32, and the power lines can be disposed on the substrate 410. At least a portion of a projection of the first electrode 111 on the substrate 410 falls within a projection of the first-display-region-located portion 16 of the power line on the substrate 410. In this manner, the first-display-region-located portion 16 of the power line can shield an electric field between the first electrode 111 and a signal line (for example, a scanning line) located below the power line in the thickness direction of the display substrate 100, to avoid the instability of the signals received by the signal line, and to improve the stability of the signals received by the first sub-pixels 11, thereby improving the display effect of the first display region 10.

The drain 252 of the second transistor 25 of the pixel circuit 22, the first segment 321, and the second segment 322 can be formed in the same process step. In this manner, the manufacturing process of the display substrate can be simplified, and the complexity of the manufacture can be reduced.

Figure 14:
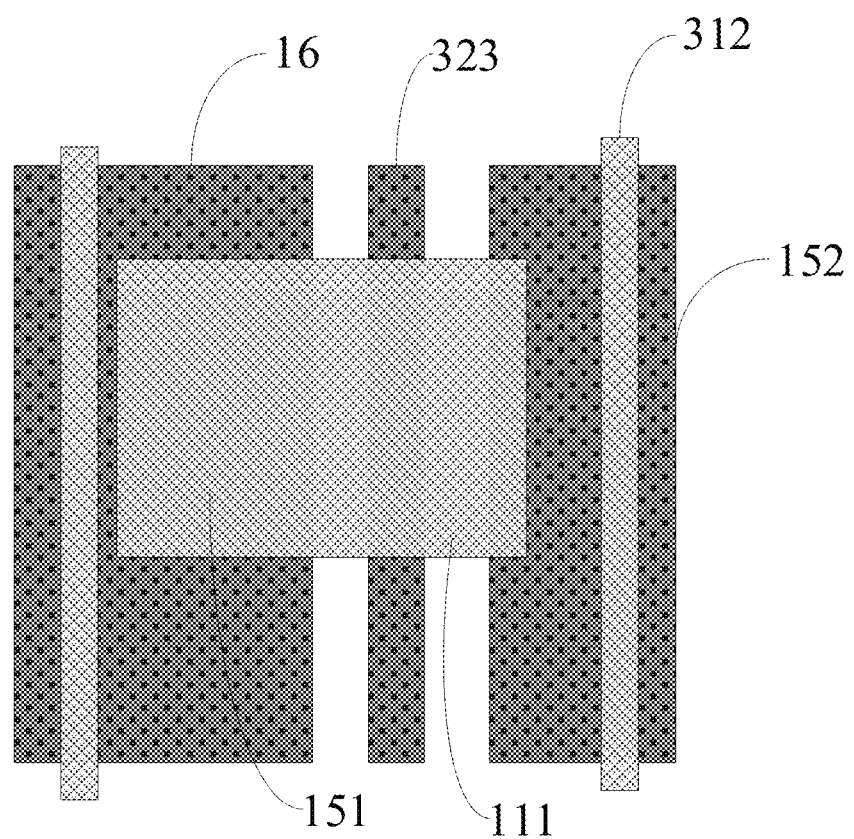
FIG. 14 is a schematic structural view of the first display region of an embodiment provided by the present disclosure.

Optionally, referring to FIG. 14, the first electrode 111 and the fifth segment 312 of the first-type data line 31 are disposed in the same layer. The first-display-region-located portion 16 of the power line, the third segment 323 of the second-type data line 32, and the upper electrode plate 152 of the capacitor are disposed in the same layer, which is different from the layer in which the first electrode 111 and the fifth segment 312 are disposed. The third segment 323 of the second-type data line 32 can be disposed between the first-display-region-located portion 16 of the power line and the upper electrode plate 152 of the capacitor. In the plane defined by the first and second directions of the display substrate 100, the area of the first-display-region-located portion 16 of the power line can be greater than the area of the upper electrode plate 152. The area of the upper electrode plate 152 can be greater than the area of the third segment 323 of the second-type data line 32.

Along a direction perpendicular to the extending direction of the first-type data line 31, a distance between the first-display-region-located portion 16 of the power line and the third segment 323 can vary continuously or intermittently. Along the direction perpendicular to the extending direction of the first-type data line 31, a distance between the third segment 323 and the upper electrode plate 152 can vary continuously or intermittently. In this manner, the position of diffraction stripes generated by the first-display-region-located portion 16 of the power line and the third segment 323 of the second-type data line 32 are different from the position of diffraction stripes generated by the third segment 323 of the second-type data line 32 and the upper electrode plate 152. Therefore, the diffraction stripes of different positions offset with each other to effectively reduced the overall diffraction effects, thereby ensuring a high definition of an image captured by a camera disposed below the first display region 10.

The third segment 323 of the second-type data line 31 and the upper electrode plate 152 can be in strip shapes, wave shapes, gourd shapes, dumbbell shapes, etc.

In another embodiment, the first segment 321, the second segment 322, and the third segment 323 are disposed in the same layer. The first segment 321 and the second segment 322 are connected to the third segment 323 respectively. In this manner, there is no need to provide any through-hole in the insulating layer for the connection between the first segment 321 and the third segment 323, and there is no need to provide any through-hole in the insulating layer for the connection between the third segment 323 and the second segment 322, thereby simplifying the manufacturing process of the second-type data lines 32.

The third segment 323 and the first-display-region-located portion 16 of the power line can be disposed in the same layer, that is, the third segment 323 and the first-display-region-located portion 16 of the power line are formed in the same process step.

The drain 252 of the second transistor 25 of the pixel circuit 22 of the second sub-pixel 21, the first segment 321, and the second segment 322 can be formed in the same step. In this manner, the manufacturing process of the display substrate 100 can be further simplified.

In a second embodiment, referring to FIG. 6, the third segment 323 of the second-type data line 32 surrounds a portion of the first display region 10, compared with arranging the third segment 323 in the first display region 10, this manner can reduce the structural complexity of the first display region 10 and increase a light transmittance of the first display region 10, and reduce the diffraction caused by the complex structure of the first display region 10 when external light entering to the first display region 10.

The third segment 323 can include a fourth sub-segment 3231, a fifth sub-segment 3232, and a sixth sub-segment 3233 connected in sequence. The fourth sub-segment 3231 and the sixth sub-segment 3233 extend in the second direction. The fifth sub-segment 3232 extends in the first direction. The fourth sub-segment 3231 is connected to the first segment 321. The sixth sub-segment 3233 is connected to the second segment 322.

The first segment 321, the second segment 322, and third segment 323 can be disposed in the same layer. In this manner, the first segment 321, the second segment 322, and the third segment 323 can be formed in the same process step, thereby simplifying the manufacturing process of the display substrate 100.

The drain 252 and the source 251 of the second transistor 25 of the pixel circuit 22 of the second sub-pixel 21, the first segment 321, the second segment 322, and the third segment 323 can be formed in the same process step. In this manner, the manufacturing process of the display substrate 100 can be further simplified.

The first-type data lines 31, the second-type data lines 32, and the power lines can be located on the substrate 410. At least a portion of a projection of the first electrode 111 on the substrate 410 falls within a projection of the first-display-region-located portion 16 of the power line on the substrate 410. In this manner, the first-display-region-located portion 16 of the power line can shield the electric field between the first electrode 111 and the signal line (for example, a scanning line) located below the power line in the thickness direction of the display substrate 100, to avoid the instability of the signals received by the signal line, and to improve the stability of the signals received by the first sub-pixels 11, thereby improving the display effect of the first display region 10.

In an embodiment, referring to FIG. 6 again, the display region of the display substrate 100 can further include a third display region 30 located between the first display region 10 and the second display region 20. The third segment 323 of the second-type data line 32 can be disposed in the third display region 30.

Optionally, no sub-pixel is disposed in the third display region 30. In operation of the display substrate 100, the third display region 30 only displays a black image, that is, the third display region 30 is in a black annular shape. In another embodiment, at least one sub-pixel can be further disposed in the third display region 30.

Optionally, the pixel circuits 12 of the first sub-pixels 11 which are adjacent to the third display region 30 can be disposed in the third display region 30. In this manner, the structural complexity of the first display region 10 can be further reduced, the diffraction of the first display region 10 can be reduced, and the light transmittance of the first display region 10 can be increased.

Optionally, referring to FIG. 4, the first-type data lines 31 and the second-type data lines 32 are alternately arranged. FIG. 4 only illustrates the embodiment that one second-type data line 32 is disposed between two adjacent first-type data lines 31. In other embodiments, two or more second-type data lines 32 can be disposed between two adjacent first-type data lines 31. Alternatively, two or more first-type data lines 31 can be disposed between two adjacent second-type data lines 32.

In another embodiment, referring to FIG. 6, the second-type data lines 32 are arranged at two opposite sides of the plurality of first-type data lines 31. When the number of the first-type data lines 31 is two or more, the two or more first-type data lines 31 are disposed adjacent to each other. When the number of the second-type data lines 32 at the same side of the first-type data lines 31 is two or more, the two or more second-type data lines 32 disposed at the same side of the first-type data lines 31 are disposed adjacent to each other. In this manner, it is easy to dispose the third segments 323 of the second-type data lines 32 in the second display region 20 or the third display region 30, the process is easier to implement.

Optionally, referring to FIGS. 3 and 5, the plurality of pixel groups in the display region of the display substrate 100 can also include a plurality of fifth-type pixel groups 103. Each fifth-type pixel group 103 includes a plurality of second sub-pixels 21. The plurality of second sub-pixels 21 of the same fifth-type pixel group 103 are arranged at the same side of the first display region 10 in the second direction. The plurality of second sub-pixels 21 of the same fifth-type pixel group 103 are spaced from each other in the first direction. Referring to FIG. 4, the display substrate 100 can also include third-type data lines 33. The pixel circuits 22 corresponding to the plurality of second sub-pixels 21 of the same fifth-type pixel group 103 are connected to the same third-type data line 33.

Optionally, referring to FIG. 3 again, the sub-pixels in the display region of the display substrate 100 also can be divided into third-type pixel groups 201, fourth-type pixel groups 202, and sixth-type pixel groups 203. The third-type pixel groups 201, the fourth-type pixel groups 202, and the sixth-type pixel groups 203 are arranged in the first direction. Each third-type pixel group 201 includes a plurality of first sub-pixels 11 and a plurality of second sub-pixels 21. Each fourth-type pixel group 202 merely includes a plurality of second sub-pixels 21. The plurality of sub-pixels of each third-type pixel group 201 are arranged in the second direction and spaced from each other. The plurality of sub-pixels of each fourth-type pixel group 202 are arranged in the second direction and spaced from each other.

It can be understood that the plurality of sub-pixels are divided into the first-type pixel groups 101, the second-type pixel groups 102, and the fifth-type pixel groups 103 along the second direction. The plurality of sub-pixels are also divided into the third-type pixel groups 201, the fourth-type pixel groups 202, and the sixth-type pixel groups 203 along the first direction. Therefore, one sub-pixel can belong to not only one group of the first-type pixel groups 101, the second-type pixel groups 102, and the fifth-type pixel groups 103, but also one group of the third-type pixel groups 201, the fourth-type pixel groups 202, and the sixth-type pixel groups 203. However, one sub-pixel can belong to neither multiple groups of the first-type pixel groups 101, the second-type pixel groups 102, and the fifth-type pixel groups 103 at the same time, nor multiple groups of the third-type pixel groups 201, the fourth-type pixel groups 202, and the sixth-type pixel groups 203 at the same time.

Figure 9:
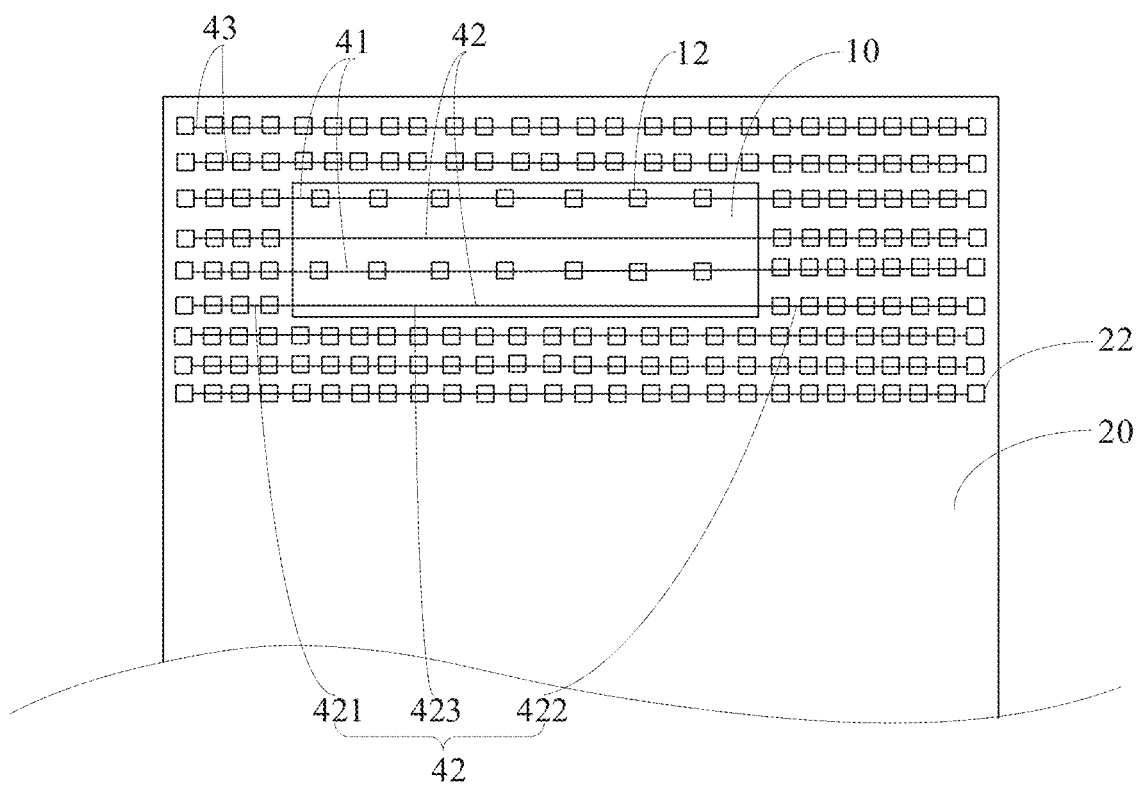
FIG. 9 is a schematic view of a layout of light-emitting control lines of the display substrate shown in FIG. 1.

In the embodiments that the pixel circuits 12 corresponding to the first sub-pixels 11 and the pixel circuits 22 corresponding to the second sub-pixels 21 are 3T1C circuits, 3T2C circuits, 7T1C circuits, or 7T2C circuits, and the light-emitting control lines of the display region are single-side driving mode, referring to FIG. 9, the display region of the display substrate 100 include first-type light-emitting control lines 41 and second-type light-emitting control lines 42. All pixel circuits 12 corresponding to the first sub-pixels 11 and all pixel circuits 22 corresponding to the second sub-pixels 21 in the same third-type pixel group 201 are connected to the same first-type light-emitting control line 41. All pixel circuits 22 corresponding to the second sub-pixels 21 in each fourth-type pixel group 202 are connected to the same second-type light-emitting control line 42. The first-type light-emitting control lines 41 and the second-type light-emitting control lines 42 are configured to provide light-emitting control signals to the sub-pixels. Since the pixel circuits 12 corresponding to the first sub-pixels 11 and the pixel circuits 22 corresponding to the second sub-pixels 21 in the same third-type pixel group 201 are connected to the same first-type light-emitting control line 41, the first sub-pixels 11 and the second sub-pixels 21 in the third-type pixel group 201 can be driven by the same first-type light-emitting control line 41, so that the wiring complexity in the display region of the display substrate 100 can be reduced, and the first display region 10 and the second display region 20 can achieve more consistent display effect to improve the user experience as well.

Optionally, referring to FIG. 3 again, the second sub-pixels 21 of the same third-type pixel group 201 are arranged at two opposite sides of the first display region 10 in the second direction; and/or the second sub-pixels 21 of the fourth-type pixel group 202 are arranged at two opposite sides of the first display region 10 in the second direction. When the second sub-pixels 21 in the fourth-type pixel group 202 are located at two opposite sides of the first display region 10 in the second direction, each second-type light-emitting control line 42 can include a tenth segment 421, an eleventh segment 422, and a twelfth segment 423. The tenth segment 421 and the eleventh segment 422 are located in the second display region 20 and at two opposite sides of the first display region 10. The tenth segment 421 is connected to the eleventh segment 422 by the twelfth segment 423.

The tenth segment 421, the eleventh segment 422, and the twelfth segment 423 can be located in the same layer. The twelfth segment 423 can be connected to the tenth segment 421 and the eleventh segment 422 respectively. In this manner, there is no need to provide any through-hole in the insulating layer for the connection between the tenth segment 421 and the twelfth segment 423, and there is no need to provide any through-hole in the insulating layer for the connection between the eleventh segment 422 and the twelfth segment 423, thereby simplifying the manufacturing process of the second-type light-emitting control lines 42.

Optionally, the twelfth segment 423 can be located in the first display region 10. The light transmittance of the twelfth segment 423 can be greater than or equal to 70%. Optionally, the light transmittance of the twelfth segment 423 can be greater than or equal to 90%. For example, the light transmittance of the twelfth segment 423 can be 90%, 95%, etc. In this manner, the light transmittance of the first display region 10 can be relatively high to satisfy the light-receiving requirement of the photosensitive member disposed below the first display region 10.

The material of the twelfth segment 423 can include at least one of indium tin oxide, indium zinc oxide, silver-doped indium tin oxide, and silver-doped indium zinc oxide. Optionally, the twelfth segment 423 is made of silver-doped indium tin oxide or silver-doped indium zinc oxide, to reduce the resistance of the twelfth segment 423 while ensuring a high light transmittance of the first display region 10.

In another embodiment, the twelfth segment 423 can surround a part of the first display region 10, compared with arranging the twelfth segment 423 in the first display region 10, this manner can reduce the structural complexity of the first display region 10, and increase the light transmittance of the first display region 10, and reduce the diffraction caused by the complex structure of the first display region 10 when external light entering the first display region 10.

Optionally, the twelfth segment 423 can be disposed in the third display region 30.

Optionally, referring to FIG. 3, each sixth-type pixel group 203 can include a plurality of second sub-pixels 21. The plurality of second sub-pixels 21 of the sixth-type pixel group 203 are disposed at one side of the first display region 10 in the first direction. The plurality of second sub-pixels 21 of the same sixth-type pixel group 203 are arranged in the second direction and spaced from each other. The display substrate 100 can also include third-type light-emitting control lines 43. The pixel circuits 22 corresponding to the plurality of second sub-pixels 21 in the same sixth-type pixel group 203 are connected to the same third-type light-emitting control line 43.

Figure 10:
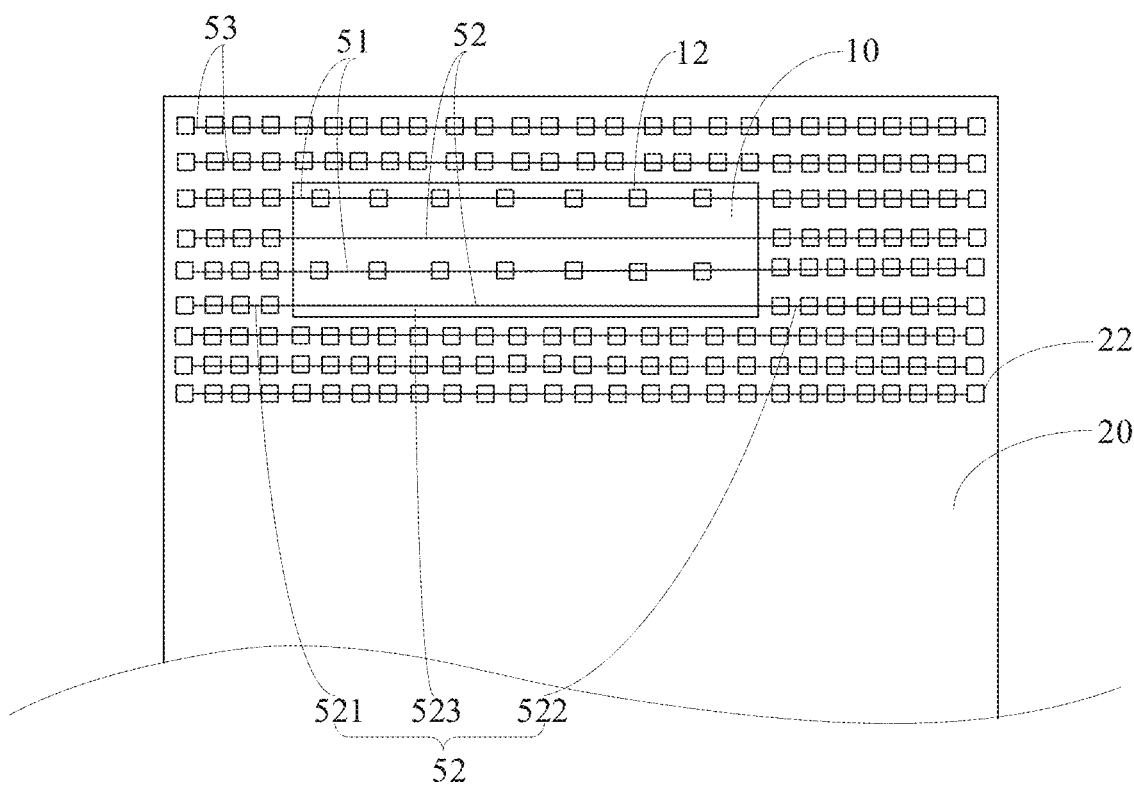
FIG. 10 is a schematic view of a layout of scanning lines of the display substrate shown in FIG. 1.

Optionally, when the scanning lines of the display region are single-side driving mode, referring to FIG. 10, the display region includes first-type scanning lines 51 and second-type scanning lines 52. All pixel circuits 12 corresponding to the first sub-pixels 11 and all pixel circuits 22 corresponding to the second sub-pixels 21 in the same third-type pixel group 201 are connected to the same first-type scanning line 51. All pixel circuits 22 corresponding to the second sub-pixel 21 in each fourth-type pixel group 202 are connected to the same second-type scanning line 52. The first-type scanning lines 51 and the second-type scanning lines 52 are configured to provide scanning signals to the sub-pixels. Since the pixel circuits 12 corresponding to the first sub-pixels 11 and the pixel circuits 22 corresponding to the second sub-pixels 21 in the same third-type pixel group 201 are connected to the same first-type scanning line 51, the first sub-pixels 11 and the second sub-pixels 21 of the same third-type pixel group 201 can be driven by the same first-type scanning line 51, so that the wiring complexity in the display region of the display substrate 100 can be reduced, and the first display region 10 and the second display region 20 can achieve more consistent display effect to improve the user experience as well.

Optionally, referring to FIG. 3 again, the second sub-pixels 21 of the same third-type pixel group 201 are arranged at two opposite sides of the first display region 10 in the second direction; and/or the second sub-pixels 21 of the fourth-type pixel group 202 are arranged at two opposite sides of the first display region 10 in the second direction. Referring to FIG. 10, when the second sub-pixels 21 in the fourth-type pixel group 202 are arranged at two opposite sides of the first display region 10 in the second direction, each second-type scanning line 52 can include a seventh segment 521, an eighth segment 522, and a ninth segment 523. The seventh segment 521 and the eighth segment 522 are located in the second display region 20 and at two opposite sides of the first display region 10. The seventh segment 521 is connected to the eighth segment 522 by the ninth segment 523.

The seventh segment 521, the eighth segment 522, and the ninth segment 523 can be located in the same layer. The ninth segment 523 can connect to the seventh segment 521 and the eighth segment 522 respectively. In this manner, there is no need to provide any through-hole in the insulating layer for the connection between the seventh segment 521 and the ninth segment 523, and there is no need to provide any through-hole in the insulating layer for the connection between the eighth segment 522 and the ninth segment 523, thereby simplifying the manufacturing process of the second-type scanning lines 52.

Optionally, the ninth segment 523 can be located in the first display region 10. The light transmittance of the ninth segment 523 can be greater than or equal to 70%. Optionally, the light transmittance of the ninth segment 523 can be greater than or equal to 90%. For example, the light transmittance of the ninth segment 523 can be 90%, 95%, etc. In this manner, the light transmittance of the first display region 10 can be relatively high to satisfy the light-receiving requirement of the photosensitive member disposed below the first display region 10.

The material of the ninth segment 523 can include at least one of indium tin oxide, indium zinc oxide, silver-doped indium tin oxide, and silver-doped indium zinc oxide. Optionally, the ninth segment 523 is made of silver-doped indium tin oxide or silver-doped indium zinc oxide, to reduce the resistance of the ninth segment 523 while ensuring a high light transmittance of the first display region 10.

In another embodiment, the ninth segment 523 can surround a part of the first display region 10, compared with arranging the ninth segment 523 in the first display region 10, this manner can reduce the structural complexity of the first display region 10, and increase the light transmittance of the first display region 10, and reduce the diffraction caused by the complex structure of the first display region 10 when external light entering to the first display region 10.

Optionally, the ninth segment 523 can be disposed in the third display region 30.

Optionally, the sixth-type pixel group 203 includes a plurality of second sub-pixels 21. The plurality of second sub-pixels 21 of the sixth-type pixel group 203 are disposed at one side of the first display region 10 in the first direction. The plurality of second sub-pixels 21 of the same sixth-type pixel group 203 are arranged in the second direction and spaced from each other. The display substrate 100 can also include third-type scanning lines 53. The pixel circuits 22 corresponding to the plurality of second sub-pixels 21 in the same sixth-type pixel group 203 are connected to the same third-type scanning line 53.

Optionally, the first electrode 111 of each first sub-pixel 11 can include at least one first electrode block. The light-emitting structure includes a light-emitting structure block correspondingly disposed on each first electrode block.

Figure 11:
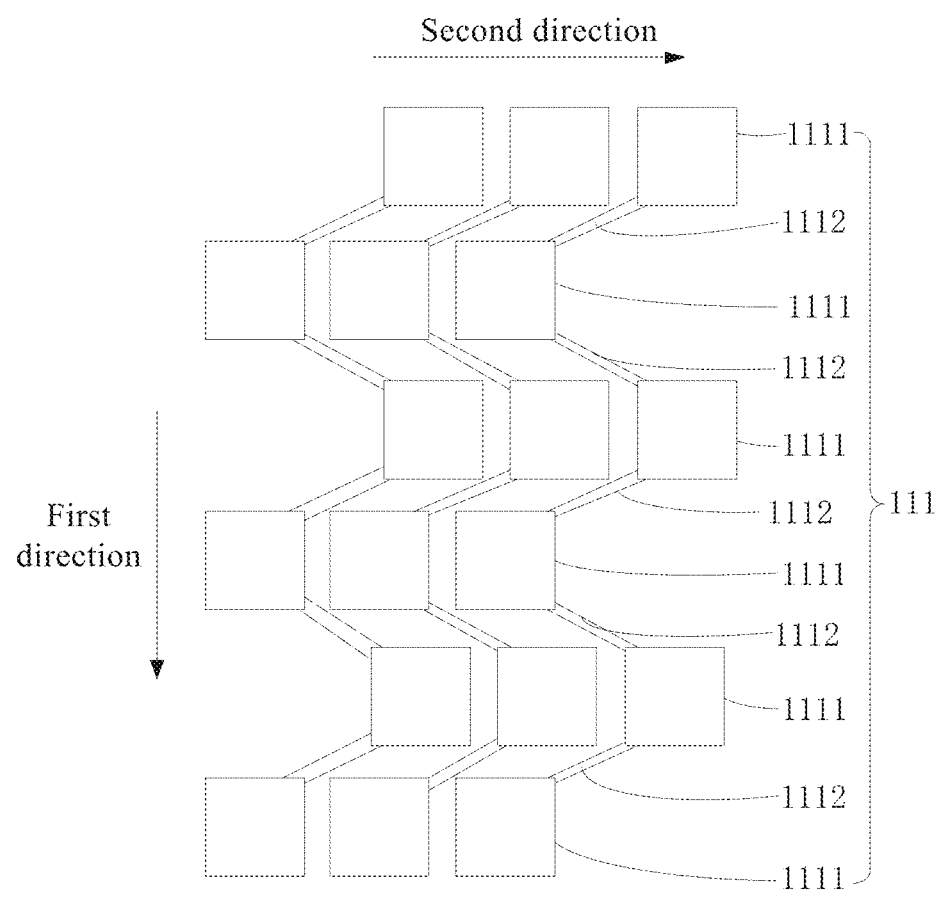
FIG. 11 is a schematic view of a projection of first electrodes on a substrate of an embodiment, provided by the present disclosure.
Figure 12:
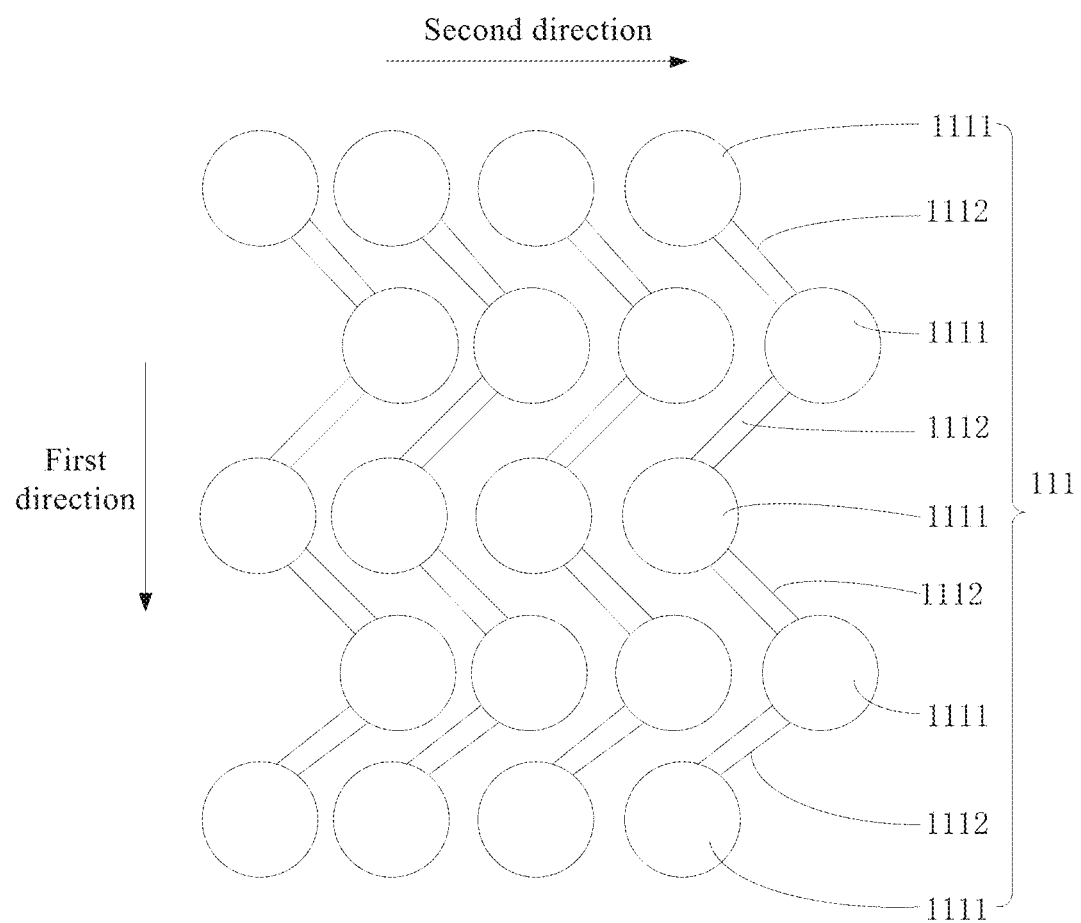
FIG. 12 is a schematic view of a projection of the first electrodes on the substrate of another embodiment, in which a shape of the first electrodes is different from that in FIG. 11, provided by the present disclosure.
Figure 13:
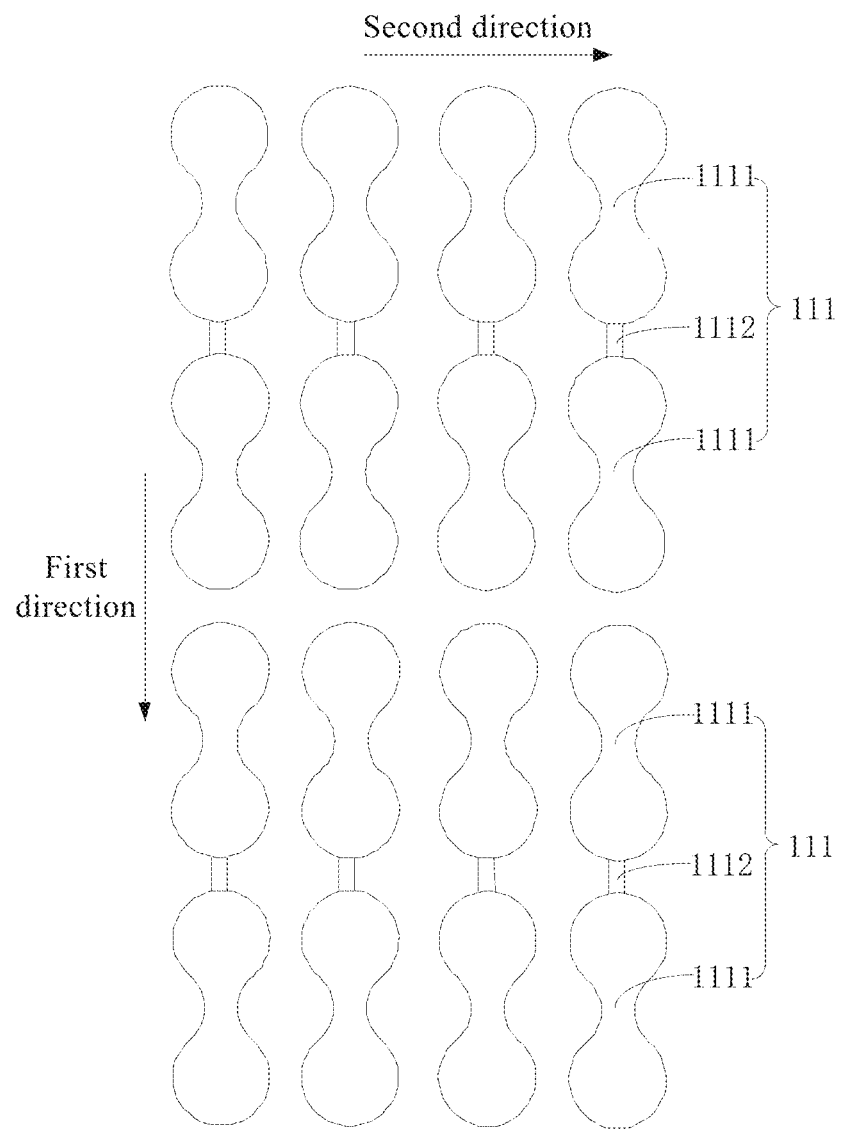
FIG. 13 is a schematic view of a projection of the first electrodes on the substrate of yet another embodiment, in which the shape of the first electrodes is different from that in FIG. 11, provided by the present disclosure.

Optionally, referring to FIGS. 11 to 13, each first electrode 111 includes two or more first electrode blocks 1111 which are arranged in the first direction and spaced from each other. The first electrode 111 further includes a plurality of connecting portions 1112, each connecting portion 1112 is disposed between two adjacent first electrode blocks 1111. The two adjacent first electrode blocks 1111 are electrically connected by a corresponding connecting portion 1112. In this manner, signals can be provided to the first electrode blocks 1111 of the first electrode 111 by one data line or one scanning line, so that the wiring complexity of the first display region can be reduced, and the diffraction superposition phenomenon caused by the complex wiring in the first display region during the light transmission can be effectively reduced, thereby improving the quality of the image captured by the camera disposed on a back surface of the first display region, and avoiding the image distortion. Further, the plurality of first electrode blocks 1111 of the same first electrode 111 are electrically connected with each other, so that the light-emitting structure blocks correspondingly disposed on the first electrode blocks 1111 of the same first electrode 111 can be controlled to simultaneously emit lights or to be simultaneously turned off, thereby simplifying the control of the first display region 10.

Optionally, the first electrode blocks 1111 and the connecting portions 1112 of the same first electrode 111 are disposed in the same layer. In this manner, the first electrode blocks 1111 and the connecting portions 1112 of the same first electrode 111 can be formed in the same process step, thereby reducing the complexity of the manufacturing process.

Optionally, the connecting portion 1112 has a size in a direction perpendicular to its extending direction, and the size is greater than 3 m and smaller than half of the maximum size of the first electrode block 1111. The resistance of the connecting portion 1112 can be relatively small when the size of the connecting portion 1112 in the direction perpendicular to the extending direction is greater than 3 m. The effect of the connecting portion 1112 on the size of the first electrode block 1111 is reduced when the size of the connecting portion 1112 is smaller than half of the maximum size of the first electrode block 1111. This prevents reducing the size of the first electrode block 1111 caused by a relatively large size of the connecting portion 1112, and prevents reducing the effective light-emitting area of the first display region 10.

Optionally, the projection of each first electrode block 1111 of the first electrode 111 on the substrate 410 of the display substrate 100 is composed of one or more first graphic elements. The first graphic element can include a circle shape, an ellipse shape, a dumbbell shape, a gourd shape, or a rectangle shape.

Referring to FIG. 11, each of the first electrodes 111 in the first display region 10 includes six first electrode blocks 1111. The projection of each first electrode block 1111 on the substrate is composed of one first graphic element which is in a rectangular shape. Referring to FIG. 12, each of the first electrodes 111 in the first display region 10 includes five first electrode blocks 1111. The projection of each first electrode block 1111 on the substrate is composed of one first graphic element which is in a circular shape. Referring to FIG. 13, each of the first electrodes 111 in the first display region 10 includes two first electrode blocks 1111. The projection of each first electrode block 1111 on the substrate is composed of one first graphic element which is in dumbbell shape. The first graphic element can be in the circular shape, the elliptical shape, the dumbbell shape, or the gourd shape, this can change a periodic structure of the diffraction, that is, change distribution of the diffraction field, thereby reducing the diffraction when the external light enters in the first display region 10. When the first graphic element is in the above-described shape, the size of the first electrode 111 varies continuously or intermittently in the first direction, and a distance between two adjacent first electrodes 111 in the second direction varies continuously or intermittently along the first direction, so that positions of diffraction of two adjacent first electrodes 111 are different, and the diffractions in different positions offset with each other to effectively reduce the overall diffraction, ensuring a high definition of an image captured by a camera disposed below the first display region 10.

Optionally, referring to FIGS. 11 and 12, in the first direction, two adjacent first electrode blocks 1111 of the plurality of first electrode blocks 1111 of the same first electrode 111 are arranged in a staggered manner. In this manner, the diffraction can be further reduced when the external light is enters in the first display region 10.

Optionally, in the plurality of first electrode blocks 1111 of the same first electrode 111, two first electrode blocks 1111 with one first electrode block 1111 located therebetween have their central axes coincided in the second direction. In this manner, the arrangement of the first electrode blocks 1111 is more regular, and the arrangement of the light-emitting structure blocks correspondingly disposed on the first electrode blocks 1111 are more regular, and the arrangement of the opening of the mask that is used to form the light-emitting structure blocks is more regular. In addition, the light-emitting structure blocks of the first display region 10 of the display substrate 100 and the light-emitting structure blocks of the second display region 20 of the display substrate 100 can be formed in the same evaporation process by using the same mask. Since patterns on the mask are relatively uniform, spreading wrinkles may be reduced.

Optionally, the projection of each light-emitting structure block correspondingly disposed on each first electrode block on the substrate is composed of one or more second graphic elements. The second graphic element and the first graphic element have the same or different shapes. Optionally, the shape of the first graphic element is different from that of the second graphic element, and therefore, the projection of each light-emitting structure block which is correspondingly disposed on each first electrode block 1111 on the substrate is different from the projection of the first electrode block on the substrate, thereby further reducing the diffraction of external light entering the first display region 10.

The second graphic element can include a circle shape, an ellipse shape, a dumbbell shape, a gourd shape, or a rectangle shape.

Optionally, the light transmittances of the first-display-region-located portion of the first-type data line 31, the first electrode, and/or the second electrode are greater than or equal to 70%. Optionally, the light transmittances of the first-display-region-located portion of the first-type data line 31, the first electrode 111, and/or the second electrode can be greater than or equal to 90%. For example, the light transmittances can be 90%, 95%, etc. In this manner, the light transmittance of the first display region 10 can be relatively high to satisfy the light-receiving requirement of the photosensitive member disposed below the first display region 10.

The materials of the first-display-region-located portion of the first-type data line 31, the first electrode 111, and/or the second electrode can include at least one of indium tin oxide, indium zinc oxide, silver-doped indium tin oxide, and silver-doped indium zinc oxide. Optionally, the first-display-region-located portion of the first-type data line 31, the first electrode 111, and/or the second electrode are made of silver-doped indium tin oxide or silver-doped indium zinc oxide, to reduce the resistances of the first-display-region-located portion of the first-type data line 31, the first electrode, and/or the second electrode while ensuring a high light transmittance of the first display region 10.

In an embodiment of the present disclosure, the shape of the first display region 10 of the display substrate 100 can be a droplet shape, a circle shape, a rectangle shape, a semicircle shape, a semi-ellipse shape, or an ellipse shape, etc., but not limited to these, and the shape of the first display region 10 of the display substrate 100 can be in another shape in accordance with an actual situation. Optionally, the first direction can be perpendicular to the second direction. The first direction can be a column direction, and the second direction can be a row direction. Alternatively, the first direction can be a row direction, and the second direction can be a column direction. The drawings of the present disclosure only illustrate the embodiment that the first direction is the column direction, and the second direction is the row direction, while other embodiments are not illustrated in the drawings. An embodiment of the present disclosure also provides a display panel, which includes the above-mentioned display substrate 100 and an encapsulation layer. The encapsulation layer is disposed on a side of the display substrate 100 deviating from the substrate.

Optionally, the first display region 10 is at least partly surrounded by the second display region 20. As shown in FIG. 1, the first display region 10 is partly surrounded by the second display region 20. In other embodiments, the first display region 10 can also be completely surrounded by the second display region 20.

Optionally, the encapsulation layer can include a polarizer which at least covers the second display region 20. Further, the polarizer does not cover the first display region 10, and a photosensitive member configured to emit or receive light by the first display region 10 can be disposed below the first display region 10. The polarizer can dissipate reflected light from a surface of the display panel, thereby improving the user's experience. The first display region 10 is not provided with the polarizer, so that the light transmittance of the first display region 10 can be increased, thereby ensuring the normal operation of the photosensitive member disposed below the first display region 10.

In the display panel provided by the embodiments of the present disclosure, since the light transmittance of the first display region 10 is greater than the light transmittance of the second display region 20, the photosensitive member can be disposed below the first display region 10, thereby realizing the full-screen display of the display substrate 100 while ensuring the normal operation of the photosensitive member. Since the pixel circuits 12 corresponding to the first sub-pixels 11 and the pixel circuits 22 corresponding to the second sub-pixels 21 in the same first-type pixel group 101 are all connected to the same first-type data line 31, the first sub-pixels 11 and the second sub-pixels 21 in the first-type pixel group 101 can be driven by the same first-type data line 31, so that the wiring complexity in the display region of the display substrate 100 can be reduced, and the first display region 10 and the second display region 20 can achieve more consistent display effect to improve the user experience as well. Since the first-display-region-located portion (e.g., the fifth segment 312) of the first-type data line 31 and the first electrode 111 are disposed in the same layer, and the first-display-region-located portion 16 of the power line is disposed below the first-display-region-located portion of the first-type data line 31, the signal interference between the first-display-region-located portion of the first-type data line 31 and another signal line (such as a gate line) that is in the first display region 10 and below the power line can be reduced by the first-display-region-located portion 16 of the power line, thereby improving the stability of signals received by the first-type data line 31 and the other signal line located below the power line in the first display region, and improving the display effect of the display substrate.

An embodiment of the present disclosure also provides a display device, which includes a device body and the above-mentioned display panel. The device body has a member arranging region. The display panel covers the device body. The member arranging region is located below the first display region. A photosensitive member configured to receive light through the first display region is arranged in the member arranging region.

The photosensitive member can include a camera and/or a light sensor. In addition to the photosensitive member, other members, such as a gyroscope or an earphone, can also be arranged in the member arranging region. The member arranging region can be a grooved region, and the first display region of the display panel can be arranged corresponding to the grooved region, so that the photosensitive member is capable of emitting or receiving light through the first display region.

The above-mentioned display device can be a digital device, such as a mobile phone, a tablet, a palmtop, or an iPod.

In the display device provided by embodiments of the present disclosure, since the light transmittance of the first display region 10 is greater than the light transmittance of the second display region 20, the photosensitive member can be disposed below the first display region 10, thereby realizing the full-screen display of the display substrate 100 while ensuring the normal operation of the photosensitive member. Since the pixel circuits 12 corresponding to the first sub-pixels 11 and the pixel circuits 22 corresponding to the second sub-pixels 21 in the same first-type pixel group 101 are all connected to the same first-type data line 31, the first sub-pixels 11 and the second sub-pixels 21 in the first-type pixel group 101 can be driven by the same first-type data line 31, so that the wiring complexity of the display region of the display substrate 100 can be reduced, and the first display region 10 and the second display region 20 can achieve more consistent display effect to improve the user experience as well. Since the first-display-region-located portion of the first-type data line 31 and the first electrode 111 are disposed in the same layer, and the first-display-region-located portion 16 of the power line is disposed below the first-display-region-located portion of the first-type data line 31, the signal interference between the first-display-region-located portion of the first-type data line 31 and another signal line (such as a gate line) that is located in the first display region 10 and below the power line can be reduced by the first-display-region-located portion of the power line, thereby improving the stability of signals received by the first-type data line 31 and the other signal line located below the power line in the first display region 10, and improving the display effect of the display substrate.

The technical features of the above-described embodiments can be arbitrarily combined. In order to simplify the description, not all possible combinations of the technical features are described in the above embodiments. However, all combinations of these technical features should be considered within the scope of the present disclosure as long as such combinations do not contradict with each other.

What described above are only several implementations of the present disclosure, and these embodiments are specific and detailed, but not intended to limit the scope of the present disclosure. It should be noted that various variations and improvements can be made by a person skilled in the art without departing from the concept of the present disclosure, and all fall within the protection scope of the present disclosure. Therefore, the patent protection scope of the present disclosure shall be defined by the appended claims.

What is claimed is:

1. A display substrate, comprising a display region, wherein:
   the display region comprises a first display region and a second display region;
   a light transmittance of the first display region is greater than a light transmittance of the second display region;
   the display region comprises a plurality of sub-pixels, the plurality of sub-pixels are divided into a plurality of pixel groups arranged in a second direction;
   the plurality of pixel groups comprises a plurality of first-type pixel groups and a plurality of second-type pixel groups;
   the plurality of sub-pixels comprises a plurality of first sub-pixels disposed in the first display region and a plurality of second sub-pixels disposed in the second display region;
   a distribution density of the plurality of first sub-pixels is smaller than a distribution density of the plurality of second sub-pixels;
   each of the first-type pixel groups comprises a first set of the plurality of first sub-pixels arranged in a first direction and a first set of the plurality of second sub-pixels arranged in the first direction;
   each of the second-type pixel groups comprises a second set of the plurality of second sub-pixels arranged in the first direction;
   the second sub-pixels of at least one of each of the first-type pixel groups and each of the second-type pixel groups are disposed at two opposite sides of the first display region in the first direction;

the display region comprises a plurality of first-type data lines, a plurality of second-type data lines, at least one power line, and a plurality of pixel circuits corresponding to the plurality of sub-pixels in an one-to-one manner;

the pixel circuits corresponding to the first sub-pixels respectively and the pixel circuits corresponding to the second sub-pixels respectively in a same first-type pixel group are connected to a same first-type data line;

the pixel circuits corresponding to the second sub-pixels respectively in a same second-type pixel group are connected to a same second-type data line; and in a thickness direction of the display substrate, a first-display-region-located portion of each of the at least one power line is disposed below a first-display-region-located portion of each of the plurality of the first-type data lines.

2. The display substrate of claim 1, wherein each of the first sub-pixels comprises a first electrode, a first light-emitting structure located on the first electrode, and a second electrode located on the first light-emitting structure; and wherein the first-display-region-located portion of each of the first-type data lines and the first electrode are disposed in a same layer.

3. The display substrate of claim 1, wherein the first-display-region-located portion of at least one of the first-type data lines and a second-display-region-located portion of at least one of the first-type data lines are disposed in different layers; wherein the display substrate further comprises an insulating layer; and wherein the first-display-region-located portion of the at least one of the first-type data lines and the second-display-region-located portion of the at least one of the first-type data lines are disposed on two opposite surfaces of the insulating layer, and are connected through a first through-hole in the insulating layer.

4. The display substrate of claim 1, wherein the plurality of first-type data lines and the plurality of second-type data lines are alternately arranged; or wherein the plurality of second-type data lines are arranged at two opposite sides of the plurality of first-type data lines.

5. The display substrate of claim 1, wherein each of the pixel circuits corresponding to the first sub-pixels comprises a first capacitor; wherein the first capacitor comprises a lower electrode plate and an upper electrode plate disposed opposite to each other; and wherein the upper electrode plate is the first-display-region-located portion of the power line.

6. The display substrate of claim 1, wherein:
the plurality of pixel groups arranged in the second direction further comprise a plurality of fifth-type pixel groups;
each of the fifth-type pixel groups comprises a third set of the plurality of second sub-pixels;
the second sub-pixels of a same fifth-type pixel group are arranged at a same side of the first display region in the second direction; and
the display region further comprises a plurality of third-type data lines; the pixel circuits corresponding to the second sub-pixels in the same fifth-type pixel group are connected to a same third-type data line.

7. The display substrate of claim 1, wherein:
the second sub-pixels of each of the second-type pixel groups are disposed at two opposite sides of the first display region in the first direction;
each of the second-type data lines comprises a first segment, a second segment, and a third segment;

the first segment and the second segment are respectively located at two opposite sides of the first display region in the first direction; and
the third segment is connected between the first segment and the second segment, and the third segment is disposed in the first display region.

8. The display substrate of claim 7, wherein a light transmittance of the third segment is greater than or equal to 70%.

9. The display substrate of claim 7, wherein a material of the third segment comprises at least one of indium tin oxide, indium zinc oxide, silver-doped indium tin oxide, and silver-doped indium zinc oxide.

10. The display substrate of claim 7, wherein:
the first segment and the second segment are disposed in a same layer;
the first segment and the third segment are disposed in different layers;
the display substrate further comprises an insulating layer disposed between the third segment and the first segment in the thickness direction of the display substrate;
the insulating layer is provided with a plurality of second through-holes;
the first segment and the second segment are respectively connected to the third segment through the second through-holes.

11. The display substrate of claim 10, wherein:
each of the first sub-pixels comprises a first electrode, a first light-emitting structure located on the first electrode, and a second electrode located on the first light-emitting structure;
the third segment and the first electrode are disposed in a same layer; and
the first segment, the second segment, and the at least one power line are disposed in a same layer.

12. The display substrate of claim 2, wherein:
the display substrate further comprises a substrate;
the first electrode, the plurality of first-type data lines, the plurality of second-type data lines, and the at least one power line are disposed above the substrate; and
at least a portion of a projection of the first electrode on the substrate falls within a projection of the first-display-region-located portion of the power line on the substrate.

13. The display substrate of claim 1, wherein:
the display region further comprises a third display region located between the first display region and the second display region; no sub-pixel is disposed in the third display region;
the second sub-pixels of each of the second-type pixel groups are disposed at two opposite sides of the first display region in the first direction;
each of the second-type data lines comprises a first segment, a second segment, and a third segment;
the first segment and the second segment are respectively located at two opposite sides of the first display region in the first direction;
the third segment is connected between the first segment and the second segment, and the third segment is disposed in the third display region;
the third segment comprises a fourth sub-segment, a fifth sub-segment, and a sixth sub-segment connected in sequence;
the fourth sub-segment and the sixth sub-segment both extend in the second direction, and the fifth sub-segment extends in the first direction; and the fourth sub-segment is connected to the first segment, and the sixth sub-segment is connected to the second segment.

14. The display substrate of claim 1, wherein:
the plurality of sub-pixels are further divided into a plurality of pixel groups arranged in the first direction;
the plurality of pixel groups comprise a plurality of third-type pixel groups and a plurality of fourth-type pixel groups;
each of the third-type pixel groups comprises a first set of the plurality of first sub-pixels arranged in the second direction and a first set of the plurality of second sub-pixels arranged in the second direction;
each of the fourth-type pixel groups comprises a second set of the plurality of second sub-pixels arranged in the second direction;
the second sub-pixels of at least one of each of the third-type pixel groups and each of the fourth-type pixel groups are disposed at two opposite sides of the first display region in the second direction; and
the display region further comprises a plurality of first-type light-emitting control lines and a plurality of second-type light-emitting control lines;
the pixel circuits corresponding to the first sub-pixels and the pixel circuits corresponding to the second sub-pixels in a same third-type pixel group pixel are connected to a same first-type light-emitting control line;
the pixel circuits corresponding to the second sub-pixels in a same fourth-type pixel group are connected to a same second-type light-emitting control line; and
the plurality of first-type light-emitting control lines and the plurality of second-type light-emitting control lines are configured to provide light-emitting control signals to the plurality of sub-pixels.

15. The display substrate of claim 14, wherein:
the second sub-pixels of each of the fourth-type pixel groups are located at two opposite sides of the first display region in the second direction;
each of the second-type light-emitting control lines comprises a tenth segment, an eleventh segment, and a twelfth segment;
the tenth segment and the eleventh segment are respectively located in the second display region and at two opposite sides of the first display region in the second direction; and
the twelfth segment is connected between the tenth segment and the eleventh segment, and the twelfth segment is located in the first display region.

16. The display substrate of claim 1, wherein:
the plurality of sub-pixels are further divided into a plurality of pixel groups arranged in the first direction;
the plurality of pixel groups comprise a plurality of third-type pixel groups and a plurality of fourth-type pixel groups;
each of the third-type pixel groups comprises a first set of the plurality of first sub-pixels arranged in the second direction and a first set of the plurality of second sub-pixels arranged in the second direction;
each of the fourth-type pixel groups comprises a second set of the plurality of second sub-pixels arranged in the second direction;
the second sub-pixels of at least one of each of the third-type pixel groups and each of the fourth-type pixel groups are disposed at two opposite sides of the first display region in the second direction;
the display region further comprises a plurality of first-type scanning lines and a plurality of second-type scanning lines;
the pixel circuits corresponding to the first sub-pixels and the pixel circuits corresponding to the second sub-pixels in a same third-type pixel group pixel are connected to a same first-type scanning line;
the pixel circuits corresponding to the second sub-pixels in a same fourth-type pixel group are connected to a same second-type scanning line; and
the plurality of first-type scanning lines and the plurality of second-type scanning lines are configured to provide scanning signals to the sub-pixels.

17. The display substrate of claim 16, wherein:
the second sub-pixels in each of the fourth-type pixel groups are disposed at two opposite sides of the first display region in the second direction;
each of the second-type scanning lines comprises a seventh segment, an eighth segment, and a ninth segment;
the seventh segment and the eighth segment are respectively located in the second display region and at two opposite sides of the first display region in the second direction; and
the ninth segment is connected between the seventh segment and the eighth segment, and the ninth segment is located in the first display region.

18. The display substrate of claim 1, wherein:
each of the first sub-pixels comprises a first electrode, a first light-emitting structure located on the first electrode, and a second electrode located on the first light-emitting structure;
the first electrode comprises a plurality of first electrode blocks arranged at intervals along the first direction, and every two adjacent first electrode blocks are provided with at least one connecting portion therebetween; and
the plurality of first electrode blocks are arranged in a staggered manner in the first direction.

19. A display panel, comprising:
the display substrate of claim 1; and
an encapsulation structure encapsulating the display substrate.

20. A display device, comprising:
a device body having a member arranging region; and
the display panel of claim 19, the display panel covering the device body;
wherein the member arranging region is located below the first display region and comprises at least one photosensitive member configured for emitting or receiving light through the first display region.

* * * * *